US012671403B2

(12) United States Patent
Shook et al.

(10) Patent No.: US 12,671,403 B2
(45) Date of Patent: Jun. 30, 2026

(54) ISOLATED COMMUNICATIONS LANE DEMODULATOR

(71) Applicant: Texas Instruments Incorporated, Dallas, TX (US)

(72) Inventors: Adam Lee Shook, Carrollton, TX (US); Michael Ryan Hanschke, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/389,515

(22) Filed: Jul. 30, 2021

(65) Prior Publication Data

US 2023/0034417 A1     Feb. 2, 2023

(51) Int. Cl.
*H03K 5/24* (2006.01)
*G06F 1/3203* (2019.01)
*H03K 5/26* (2006.01)

(52) U.S. Cl.
CPC ......... *H03K 5/2481* (2013.01); *G06F 1/3203* (2013.01); *H03K 5/26* (2013.01)

(58) Field of Classification Search
CPC ...... H03K 5/2481; H03K 5/2472; H03K 5/26; G06F 1/3203; G06F 1/3201
See application file for complete search history.

(56) References Cited

U.S. PATENT DOCUMENTS

| | | | | |
|---|---|---|---|---|
| 2009/0091385 A1* | 4/2009 | Suzuki | ................ | H03F 3/45197 |
| | | | | 330/253 |
| 2014/0266308 A1* | 9/2014 | Goltman | ................ | G01R 19/04 |
| | | | | 327/56 |
| 2019/0356325 A1* | 11/2019 | Hu | ...................... | H03F 3/45766 |

* cited by examiner

*Primary Examiner* — Patrick C Chen
(74) *Attorney, Agent, or Firm* — Frank D. Cimino

(57) ABSTRACT

An envelope detector comprises a first differential transistor pair that receives first and second input signals, a second differential transistor pair that receives third and fourth input signals, a resistor, a current source, and a comparator. The first and second differential pairs each comprise two transistors having first current terminals coupled together and second current terminals coupled together. The resistor is coupled between the second current terminals of the first and second differential pairs. The current source has a first terminal coupled to the second terminal of the resistor and to second current terminals of the second differential pair and a second terminal configured to receive a negative supply voltage. The comparator has a negative input coupled to first current terminals of the first differential pair and a positive input coupled to first current terminals of the second differential pair.

16 Claims, 7 Drawing Sheets

ISOLATED COMMUNICATIONS LANE DEMODULATOR

BACKGROUND

Many power drivers are isolated from the digital controllers that generate the driver control signals. The isolation between power driver and digital controller allows the system to transition the voltage level, prevent disruptive ground loops, and/or implement electrical safety measures to protect system users from high voltages. Isolation channels can be vulnerable to common mode transients (CMTs) due to random mismatches and a high sensitivity to parasitic electrical parameters such as parasitic capacitances. To increase immunity to CMTs, many isolated gate drivers modulate the control signals before transmitting them across the isolation barrier and demodulate the signals on the isolated side of the isolation barrier using a preamplifier and an envelope detector. However, some envelope detectors do not reject power supply noise or common mode noise in the input signals from the preamplifier, and introduce errors into the control signals output from the isolated gate driver.

SUMMARY

An envelope detector includes a first differential pair of transistors, a second differential pair of transistors, a resistor, a current source, and a comparator. The first differential pair of transistors includes two transistors having first current terminals coupled together and second current terminals coupled together, and receives a first input signal and a second input signal. The second differential pair of transistors includes two transistors having first current terminals coupled together and second current terminals coupled together, and receives a third input signal and a fourth input signal.

The resistor has a first terminal and a second terminal. The first terminal of the resistor is coupled to the second current terminals of the first differential pair, and the second terminal of the resistor is coupled to the second current terminals of the second differential pair. The current source has a first terminal and a second terminal. The first terminal of the current source is coupled to the second terminal of the resistor and the second current terminals of the second differential pair, and the second terminal of the current source is coupled to a supply voltage rail. The comparator has a negative input and a positive input. The negative input is coupled to the first current terminals of the first differential pair, and the positive input is coupled to the first current terminals of the second differential pair.

In some implementations, a resistance of the resistor is chosen to implement a desired offset input threshold for the comparator. The first differential pair determines a peak value of the first and second input signals, and the second differential pair determines a peak value of the third and fourth input signals. In some examples, the envelope detector also includes a first filter coupled to the first current terminals of the first differential pair and a second filter coupled to the first current terminals of the second differential pair. The first and second filters are coupled to a positive supply voltage rail.

In some implementations, the resistor is a first resistor, and the first filter includes a first capacitor and a second resistor. The second filter includes a second capacitor and a third resistor. The first capacitor stores the peak value of the first and second input signals, and the second capacitor stores the peak value of the third and fourth input signals.

The time constants of the first and second filters determine a decay time of the envelope. In some examples, the envelope detector is included in a demodulator that also includes a preamplifier configured to output the first, second, third, and fourth input signals.

BRIEF DESCRIPTION OF THE DRAWINGS

For a detailed description of various examples, reference will now be made to the accompanying drawings in which.

DETAILED DESCRIPTION

The disclosed circuits include multiple (e.g., four) transistors in differential pair topologies to determine peak values in the input signals while rejecting common mode noise in the input signals and power supply noise. A first differential pair is configured to receive a first input signal and a second input signal, and includes two transistors having drain terminals coupled together and source terminals coupled together. A second differential pair is configured to receive a third input signal and a fourth input signal, and includes two transistors having drain terminals coupled together and source terminals coupled together.

In an example, a resistor is coupled between source terminals of the first differential pair and source terminals of the second differential pair. A current source is coupled to the resistor and the source terminals of the second differential pair. A comparator is included that has a first input coupled to drain terminals of the first differential pair and a second input coupled to drain terminals of the second differential pair. The comparator is configured to output a demodulated signal based on the peak values of the input signals.

Figure 1:
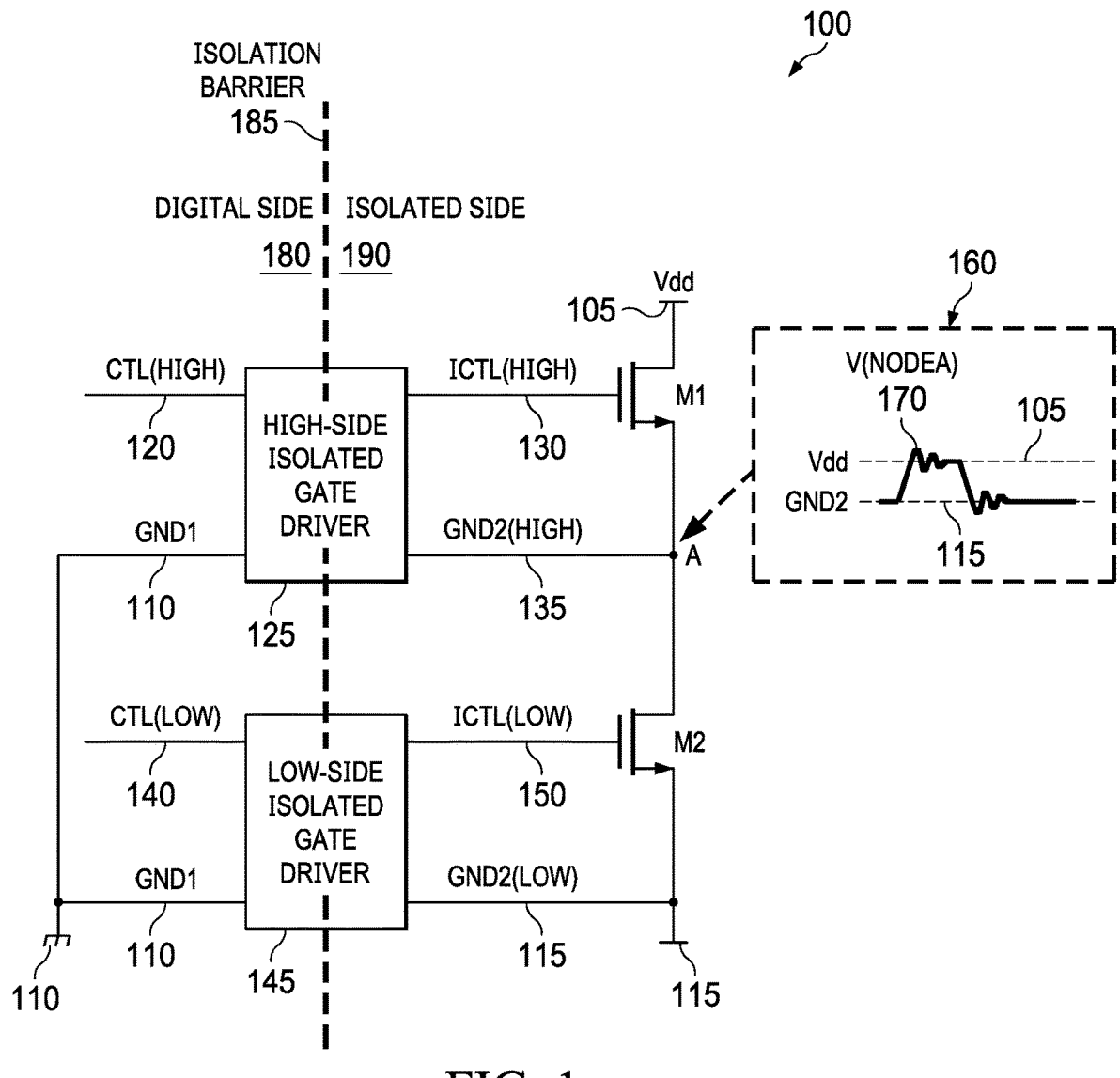
FIG. 1 shows a block diagram of a half-bridge circuit with isolated gate drivers in accordance with an example.

FIG. 1 shows a block diagram of a half-bridge circuit 100 with isolated gate drivers 125 and 145. The half-bridge circuit 100 also includes metal oxide semiconductor field effect transistors (MOSFETs) M1 and M2. In this example, high-side transistor M1 and low-side transistor M2 are n-type MOSFETs (NMOS). In other examples, either or both of M1 and M2 are p-type MOSFETs (PMOS) or bipolar junction transistors (BJTs). A BJT includes a base corresponding to a gate terminal, and a collector and an emitter corresponding to drain and source terminals. The base of the BJT and the gate terminal of a MOSFET are also called control inputs. The collector and emitter of a BJT and the drain and source terminals of a MOSFET are also called current terminals.

The high-side isolated gate driver 125 receives a high-side control signal CTL (High) 120 and is coupled to a first ground terminal GND1 110 on the digital side 180. An isolation barrier 185 separates the digital side 180 from the isolated side 190. On the isolated side 190, the high-side isolated gate driver 125 generates an isolated high-side control signal ICTL (High) 130 based on the input CTL (High) 120 and is coupled to a second, high-side ground terminal GND2 (High) 135 at node A and through M2. The gate terminal of high-side transistor M1 receives the ICTL (High) 130 from the high-side isolated gate driver 125, and the drain terminal of the high-side transistor M1 is coupled to a supply voltage rail Vdd 105. The supply voltage rail Vdd 105 can provide a voltage as high as, for example, approximately one kilovolt (1 kV). The source terminal of the high-side transistor M1 is coupled to the drain of the low-side transistor M2 at node A.

The low-side isolated gate driver 145 receives a low-side control signal CTL (Low) 140 and is coupled to the first ground terminal GND1 110 on the digital side 180. On the isolated side 190, the low-side isolated gate driver 145 outputs an isolated low-side control signal ICTL (Low) 150 and is coupled to a second, low-side ground terminal GND2 (Low) 115. The gate terminal of low-side transistor M2 receives the ICTL (Low) 150 from the low-side isolated gate driver 145. The source terminal of the low-side transistor M2 is coupled to GND2 (Low) 115.

The isolated side 190 is isolated from the digital side 180 to prevent large voltages on the supply voltage rail Vdd 105 from damaging circuits on the digital side 180 that may operate at lower voltages such as 3.3 Volts (V). However, isolation channels can be vulnerable to common mode transients (CMTs) due to random mismatches and high sensitivity to parasitic electrical parameters, such as parasitic capacitances. For example, inset 160 shows a graph of the voltage V (nodeA) 170 at node A, that is, the voltage of GND2 (High). V (nodeA) 170 transitions between the ground GND2 115 (in response to ICTL (LOW) 150 being active high to turn on M2) and the supply voltage rail Vdd 105 (in response to the control signal ICTL (High) 130 being active high indicating M1 is to be turned on). The substantial and rapid change in the voltage on the ground GND2 115 may cause a CMT current to flow, which can cause the high-side isolated gate driver 125 to resolve ICTL (HIGH) 130 incorrectly. That is, the CMT current can cause the high-side isolated gate driver 125 to drive the high-side transistor M1 incorrectly.

Figure 2:
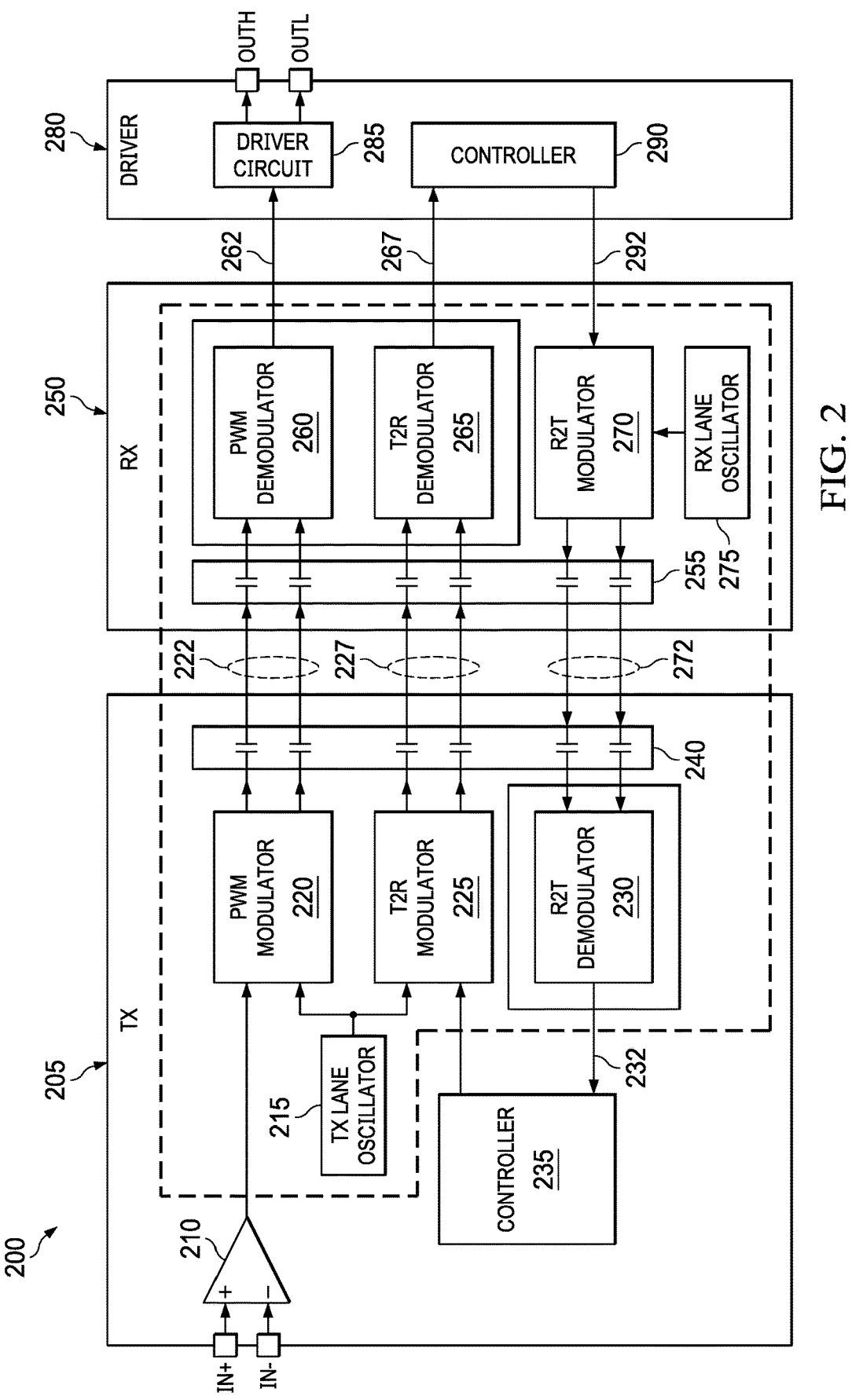
FIG. 2 shows a block diagram of a high-side isolated gate driver in accordance with an example.

To increase immunity to CMTs, the isolated gate drivers 125 and 145 modulate the input control signals CTL (High) 120 and CTL (Low) 140, respectively, on the digital side 180 and demodulate the signals on the isolated side 190. FIG. 2 shows a block diagram of a high-side isolated gate driver 200 such as high-side isolated gate driver 125. The high-side isolated gate driver 200 includes a transmitter (TX) circuit 205, a receiver (RX) circuit 250, and a driver circuit 280.

The TX circuit 205 includes a differential amplifier 210 coupled to a pulse width modulation (PWM) modulator 220. The TX circuit 205 also includes a TX lane oscillator 215, a TX-to-RX (T2R) modulator 225, an RX-to-TX (R2T) demodulator 230, and a controller 235. The TX lane oscillator 215 is coupled to the PWM controller 220 and to the T2R modulator 225. The controller 235 is coupled to the T2R modulator 225 and the R2T demodulator 230. An isolation capacitor bank 240 includes separate isolation capacitors—an isolation capacitor for each respective differential output of the PM modulator 220 and the T2R modulator 225, and each differential input of the R2T demodulator 230.

The PWM modulator 220 modulates the output of the differential amplifier 210 with a carrier signal from the TX lane oscillator 215. The PWM modulator 220 may implement on/off keying (OOK) modulation or another suitable modulation technique. The T2R modulator 225 modulates a forward lane signal 227 from the controller 235 with the carrier signal from the TX lane oscillator 215. The R2T demodulator 230 demodulates a reverse lane signal 272 from the RX circuit 250 and provides the demodulated signal 232 to the controller 235.

The RX circuit 250 includes an isolation capacitor bank 255 having an isolation capacitor for each differential signal received from and sent to the TX circuit 205. The RX circuit 250 also includes a PWM demodulator 260, a T2R demodulator 265, an R2T modulator 270, and an RX lane oscillator 275. The PWM demodulator 260 demodulates the modulated signal 222 from the PWM modulator 220 in TX circuit 205 and provides the demodulated signal 262 to a driver circuit 285 in the data recovery circuit 280. The T2R demodulator 265 demodulates the modulated forward lane signal 227 from the T2R modulator 225 and provides the demodulated signal 267 to a controller 290 in the driver circuit 280. The R2T modulator 270 receives a reverse lane signal 292 from the controller 290 in the driver circuit 280 and modulates it with a carrier signal from the RX lane oscillator 275. Each demodulator 230, 260, and 265 is vulnerable to common mode transients which can corrupt the demodulated signal and degrade system performance.

Figure 3:
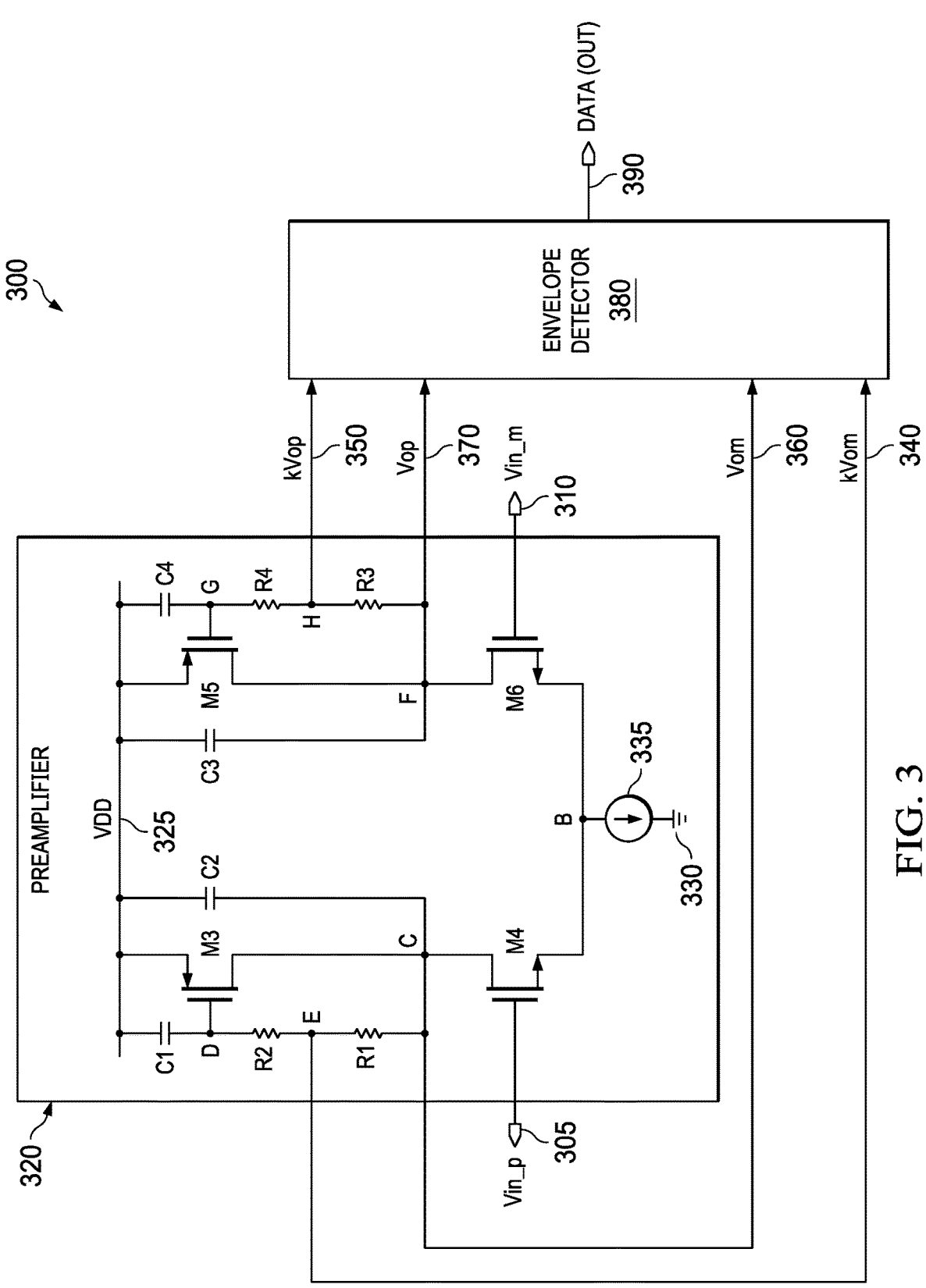
FIG. 3 shows a block diagram of a demodulator in the high-side isolated gate driver shown in FIG. 2 in accordance with an example.

FIG. 3 shows a block diagram of a demodulator 300 in the high-side isolated gate driver 200 shown in FIG. 2, such as R2T demodulator 230 in TX circuit 205 and PWM demodulator 260 and T2R demodulator 265 in RX circuit 250. The demodulator 300 includes a preamplifier 320 and an envelope detector 380. The preamplifier 320 receives a positive differential input signal Vin_p 305 and a negative differential input signal Vin_m 310, and generates differential output signals kVom 340, kVop 350, Vom 360, and Vop 370. The preamplifier 320 includes transistors M3, M4, M5, and M6; capacitors C1, C2, C3, and C4; resistors R1, R2, R3, and R4; and a current source 335. In this example, M4 and M6 are NMOS transistors and M3 and M5 are PMOS transistors. In other examples, either or both of M4 and M6 are PMOS or BJTs, and/or either or both of M3 and M5 are NMOS or BJTs.

The source terminal of M3 is coupled to a supply voltage rail configured to provide a supply voltage Vdd 325. The drain terminal of M3 is coupled to a node C. The capacitor C1 is coupled to the supply voltage Vdd 325 and to the gate terminal of M3 at a node D. The capacitor C2 is coupled to the supply voltage Vdd 325 and to a node C. The resistor R1 is coupled between the node C and a node E. The resistor R2 is coupled between the node E and node D. The output signal kVom 340 is provided at node E, and the output signal Vom 360 is provided at node C. The drain terminal of M4 is coupled to node C, and the source terminal of M4 is coupled to a node B. The gate terminal of M4 receives the positive differential input signal Vin_p 305.

The source terminal of M5 is coupled to the supply voltage rail Vdd 325. The drain terminal of M5 is coupled to a node F. The capacitor C4 is coupled to the supply voltage Vdd 325 and to the gate terminal of M5 at a node G. The capacitor C3 is coupled to the supply voltage Vdd 325 and to the node F. The resistor R3 is coupled between the node F and a node H. The resistor R4 is coupled between the node H and node G. The output signal kVop 350 is provided at node H, and the output signal Vop 370 is provided at node F. The drain terminal of M6 is coupled to node F, and the source terminal of M6 is coupled to the node B. The gate terminal of M6 receives the negative differential input signal Vin_m 310. The current source 335 is coupled to node B and to a common mode node (e.g., ground) 330.

The preamplifier 320 is a bandpass gain amplifier. While the input differential signals Vin_p 305 and Vin_m 310 are at frequencies outside the bandpass range of frequencies, the capacitors C2 and C3 short nodes C and F to the supply voltage Vdd 325, cutting off the output signals kVom 340, kVop 350, Vom 360, and Vom 370. While the input differential signals Vin_p 305 and Vin_m 310 are at frequencies within the bandpass range of frequencies, the capacitors C1 and C4 cause the M3 and M5 transistors to turn off, allowing the preamplifier 320 to apply gain. The preamplifier 320 applies a higher gain to Vom 360 and Vop 370 than to kVom 340 and kVop 350.

The gain gkm for kVom 340 is represented as:

$$gkm \sim gmn4 * R2 * \frac{C1}{(C1 + C2)}$$

where gmn4 represents the gain of the transistor M4. The gain gkp for kVop 350 is represented as:

$$gkp \sim gmn6 * R4 * \frac{C4}{(C4 + C3)}$$

where gmn6 represents the gain of the transistor M6. The larger gain gm for Vom 360 is represented as:

$$gm \sim gmn4 * (R1 + R2) * \frac{C1}{(C1 + C2)}$$

The larger gain gp for Vop 370 is represented as:

$$gp \sim gmn6 * (R3 + R4) * \frac{C4}{(C4 + C3)}$$

As explained below, envelope detector 380 receives the differential output signals kVom 340, kVop 350, Vom 360, and Vop 370 from preamplifier 320 and outputs a data signal DATA (OUT) 390. The preamplifier 320 has a common mode referenced to the supply voltage rail Vdd 325, and the envelope detector 380 has a common mode referenced to ground 330. As a result, common mode noise in the differential output signals kVom 340, kVop 350, Vom 360, and Vop 370 is indistinguishable from the data signal.

Figure 4:
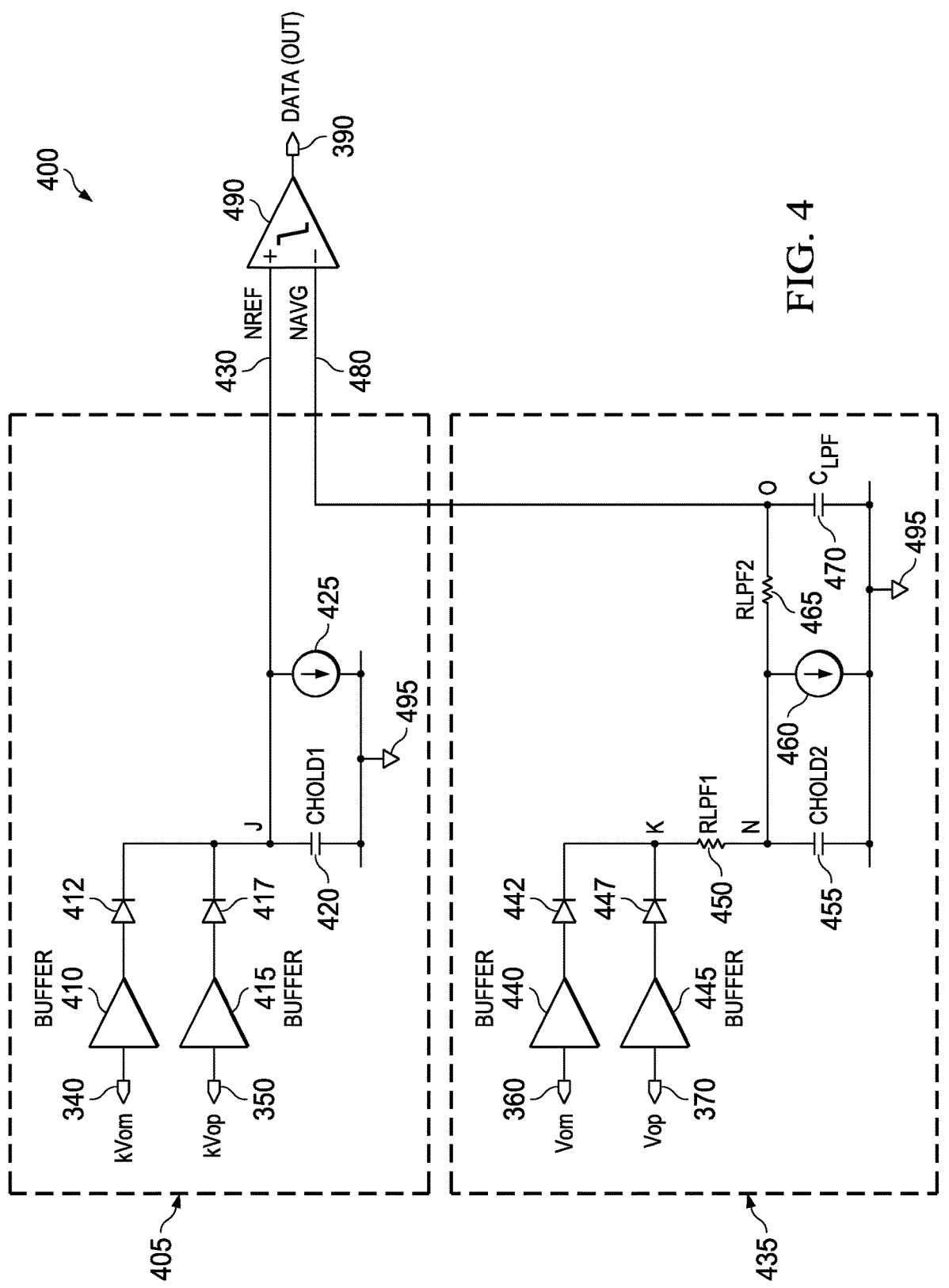
FIG. 4 shows a block diagram of a conventional envelope detector for the demodulator shown in FIG. 3 in accordance with an example.

FIG. 4 shows a block diagram of a conventional envelope detector 400 for the demodulator 300 shown in FIG. 3. The envelope detector 400 is described with reference to the differential output signals kVom 340, kVop 350, Vom 360, and Vop 370 and data signal DATA (OUT) 390 for ease of illustration. The envelope detector 400 includes two single-ended envelope detectors 405 and 435 and a comparator 490. The envelope detector 405 includes buffers 410 and 415, diodes 412 and 417, capacitor Chold1 420, and current source 425. The envelope detector 435 includes buffers 440 and 445, diodes 442 and 447, capacitors Chold2 455 and Clpf 470, current source 460, and resistors Rlpf1 450 and Rlpf2 465.

In envelope detector 405, the buffer 410 receives kVom 340 and is coupled to diode 412 to form a diode detector that detects the envelope, that is, the peak amplitude, of kVom 340. The diode 412 rectifies kVom 340 to include only the positive half of the waveform. Similarly, buffer 415 receives kVop 350 and is coupled to diode 417 to form a diode detector that detects the envelope of kVop 350. The diode 417 rectifies kVop 350 to include only the positive half of the waveform. The outputs of diodes 412 and 417 are coupled to node J. Capacitor Chold1 420 is coupled to node J and to ground 495. Current source 425 is coupled to node J and to ground 495. The peak voltage of kVom 340 and kVop 350 is stored across the capacitor Chold1 420, and the voltage nref 430 on node J is provided to the positive input of the comparator 490.

In envelope detector 435, the buffer 440 receives Vom 360 and is coupled to diode 442 to form a diode detector that detects the envelope of Vom 360. The diode 442 rectifies Vom 360 to include only the positive half of the waveform. Buffer 445 receives Vop 370 and is coupled to diode 447 to form a diode detector that detects the envelope of Vop 370. The diode 447 rectifies Vop 370 to include only the positive half of the waveform. The outputs of diodes 442 and 447 are coupled to node K. Resistor Rlpf1 450 is coupled between node K and node N. Capacitor Chold2 455 is coupled to node N and to ground 495. Current source 460 is coupled to node N and to ground 495. Resistor Rlpf2 465 is coupled between node N and node O. The capacitor Clpf 470 is coupled to node O and to ground 495. The peak voltage of Vom 360 and Vop 370 is stored across the capacitor Chold2 455 and filtered by resistors Rlpf1 450 and Rlpf2 465 and capacitor Clpf 470, which form a low pass filter to counter the higher gain that the preamplifier 320 applied to Vom 360 and Vop 370 relative to kVom 340 and kVop 350.

The filtered peak voltage navg 480 on node O is provided to the negative input of the comparator 490, which outputs the data signal DATA (OUT) 390 based on the comparison of nref 430 and navg 480. The time constants for envelope detectors 405 and 435 may not be matched, so supply noise for extended periods of time can cause the DATA (OUT) 390 signal to be resolved to an incorrect logic level. Although envelope detector 400 is shown in FIG. 4 as including buffers and diodes, in some embodiments a source-follower configured transistor is used instead. For example in place of buffer 410 and diode 412, an NMOS transistor is used. The gate terminal of the transistor is configured to receive kVom 340, the drain terminal of the transistor is coupled to a supply voltage rail, and the source terminal of the transistor is coupled to node J.

Figure 5:
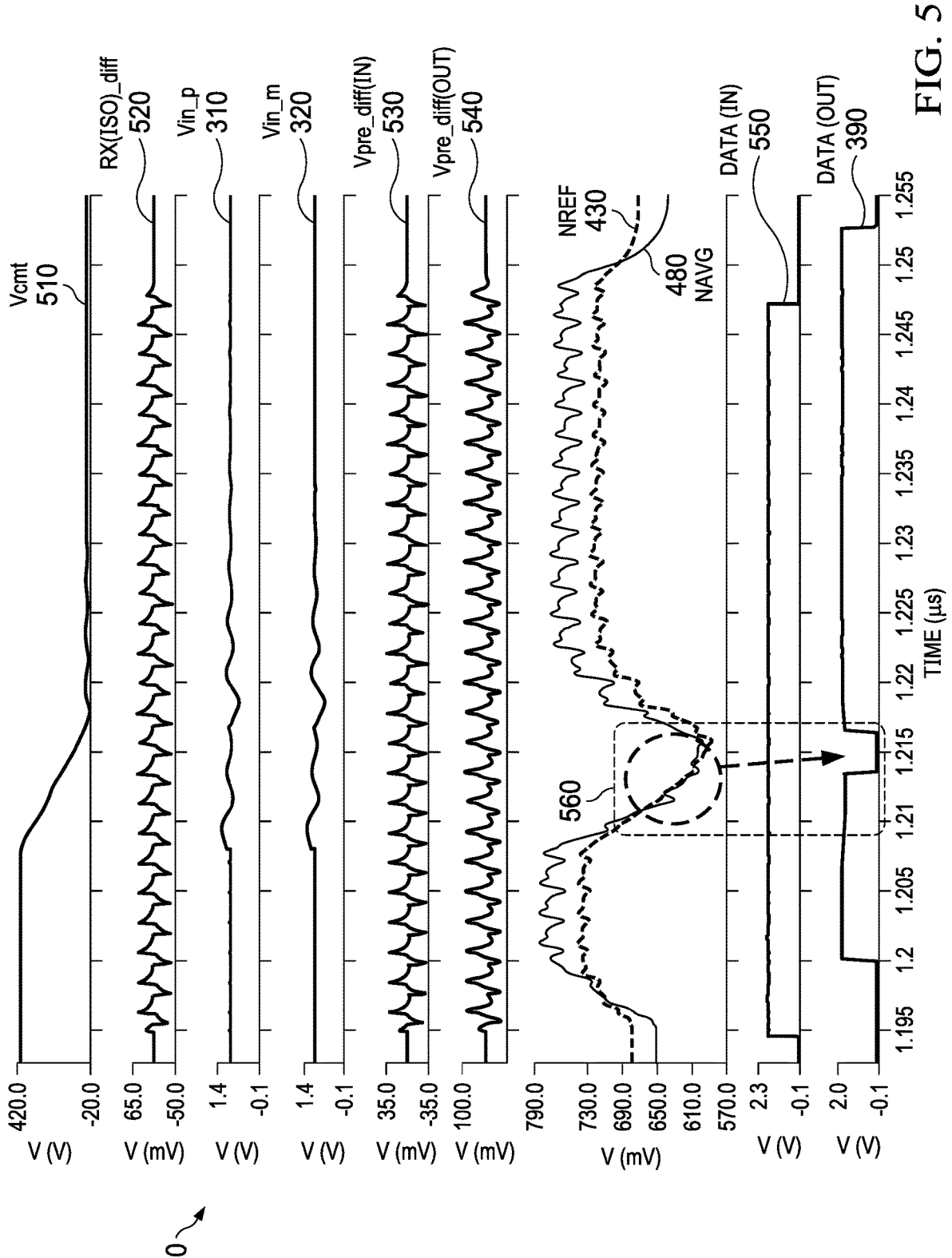
FIG. 5 illustrates waveforms of signals in the demodulator shown in FIG. 3 with the conventional envelope detector shown in FIG. 4. in accordance with an example

FIG. 5 shows waveforms of signals in the demodulator 300 shown in FIG. 3 with the conventional envelope detector 400 shown in FIG. 4 operating at a slew rate of approximately 50 Volts per nanosecond (V/ns). The first graph shows the common mode transient voltage Vcmt 510 which illustrates the change in ground voltage GND2 (High) 135 at the isolated side 190 of isolated gate driver 125. The isolated differential signal RX (ISO)_diff 520 is received at the isolation capacitors 255 and shown in the second graph.

The differential equivalent of Vin_p 305 and Vin_m 320 is shown as Vpre_diff (IN) 530 and output from the isolation capacitors 255 to the T2R demodulator 265. The differential equivalent of the output of the preamplifier 320 is shown as Vpre_diff (OUT) 540. The RX (ISO)_diff 520, Vin_p 305, Vin_m 320, Vpre_diff (IN) 530, and Vpre_diff (OUT) 540 signals appear to correspond to each other well. However at a high slew rate, Vcmt 510 can cause navg 480 to decrease below nref 430 at 560 for long enough that the comparator 490 changes logic levels, introducing an error into DATA (OUT) 390 relative to the DATA (IN) signal 550.

Figure 6:
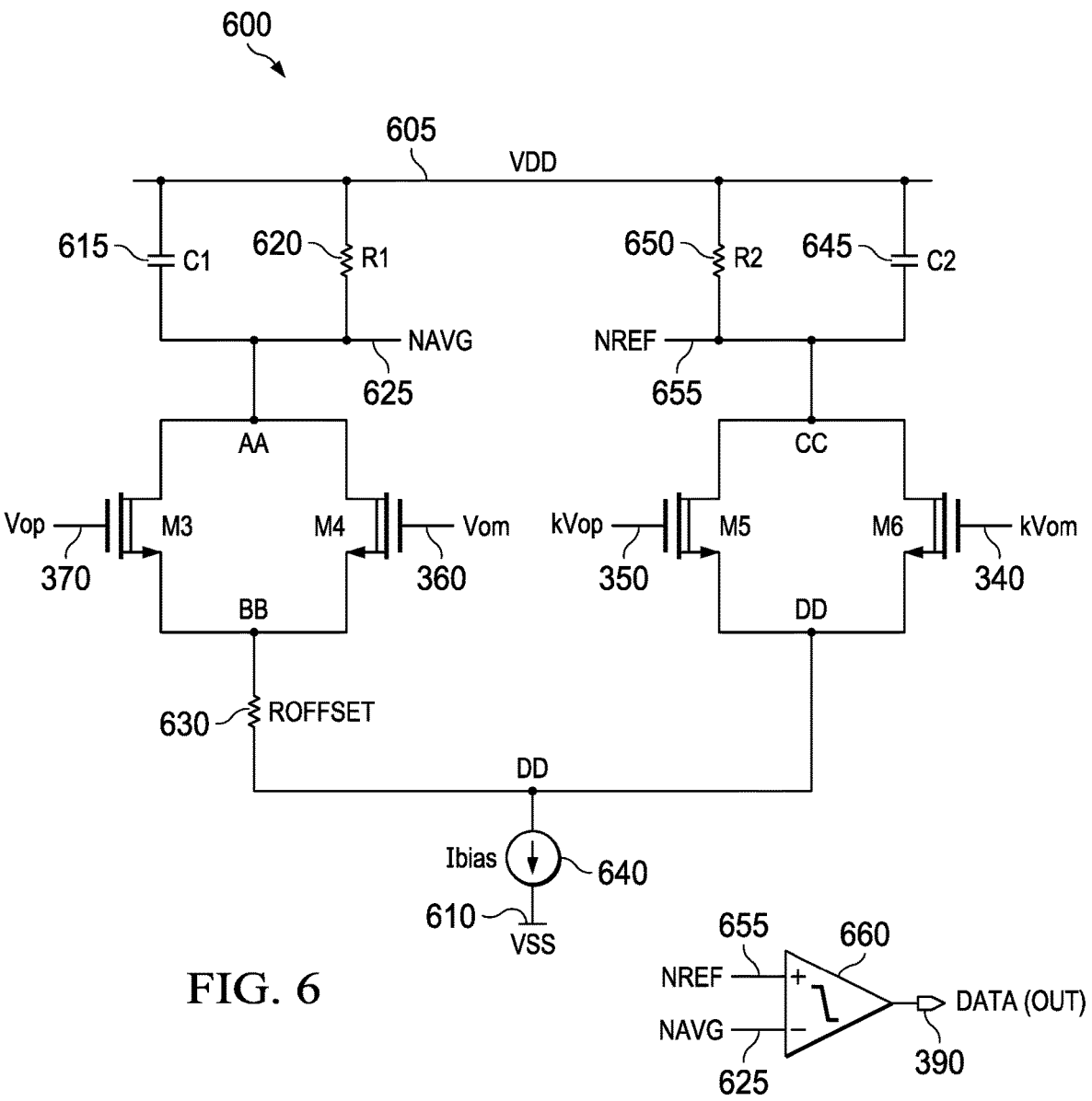
FIG. 6 shows a block diagram of an example envelope detector for the demodulator shown in FIG. 3 in accordance with an example.

FIG. 6 shows a block diagram of an example envelope detector 600 for the demodulator 300 shown in FIG. 3. The envelope detector 600 uses differential pairs to demodulate the input signals for improved common mode rejection, and includes transistors M3-M6; current source Ibias 640; capacitors C1 615 and C2 645; resistors R1 620, Roffset 630, and R2 650; and comparator 660. In this example, transistors M3-M6 are NMOS. In other examples, one or more of M3-M6 are PMOS or BJTs. The gate terminal of M3 receives Vop 370, and the gate terminal of M4 receives Vom 360. The gate terminal of M5 receives kVop 350, and the gate terminal of M6 receives kVom 340.

M3 and M4 form a first differential pair. The drain terminals of M3 and M4 are coupled together at node AA and the source terminals of M3 and M4 are coupled together at node BB. The capacitor C1 615 and the resistor R1 620 act as a filter and are coupled together in parallel between node AA and a positive supply voltage rail Vdd 605. The voltage navg 625 at node AA is provided to a negative input of the comparator 660. The resistor Roffset 630 is coupled to node BB and to the current source Ibias 640 at node DD. The resistance of Roffset 630 is chosen to set the offset input threshold between nref 655 and navg 625 zero crossing.

The current source Ibias 640 is further coupled to a negative supply voltage rail Vss 610. M5 and M6 form a second differential pair. The drain terminals of M5 and M6 are coupled together at node CC and the source terminals of M5 and M6 are coupled together at node DD. The capacitor C2 645 and the resistor R2 650 act as a filter and are coupled together in parallel between node CC and the positive supply voltage rail Vdd 605. The voltage nref 655 at node CC is provided to a positive input of the comparator 660, which outputs the DATA (OUT) signal 390. The source-coupled transistors M3 and M4 store the peak value of Vop 370 and Vom 360 across C1 615 at the drains of M3 and M4, and the source-coupled transistors M5 and M6 store the peak value of kVop 350 and kVom 340 across C2 645 at the drains of M5 and M6. The resistances of R1 620 and R2 650 determine the decay time of the envelope.

Storing the peak values at the drains of the transistors M3-M6, rather than the sources as conventional envelope detectors using source-follower configured transistors as diode detectors do, allows common mode noise at the output of preamplifier 320 to be rejected rather than rectified, reducing the influence of common mode noise in the output signal DATA (OUT) 390. In addition, the differential pair topology rejects common mode inputs to M3-M6 and has improved power supply noise rejection than the conventional envelope detector 400 described in FIG. 4. Although envelope detector 600 includes RC networks coupled to the drain terminals of M3 and M4 and to the drain terminals of M5 and M6, any appropriate type of circuit or current source can be used to store the peak values and determine the decay time of the envelope.

Figure 7:
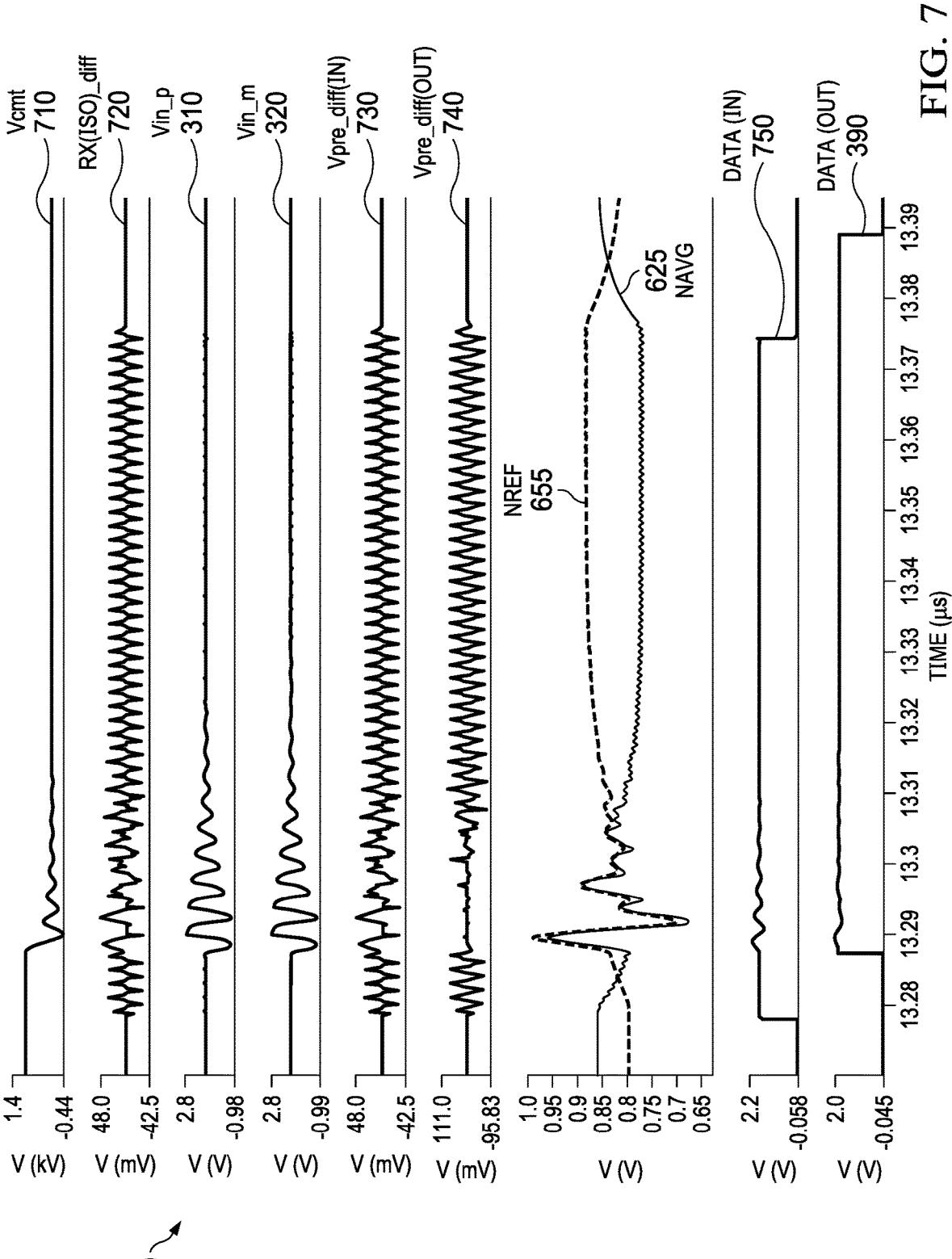
FIG. 7 shows waveforms of signals in the demodulator shown in FIG. 3 with the envelope detector shown in FIG. 6 in accordance with an example.

FIG. 7 shows waveforms of signals in the demodulator 300 shown in FIG. 3 with the envelope detector 600 shown in FIG. 6 operating at a slew rate of approximately 500 V/ns. The first graph shows the common mode transient voltage Vcmt 710 which illustrates the change in ground voltage GND2 (High) 135 at the isolated side 190 of isolated gate driver 125. The isolated differential signal RX (ISO)_diff 720 is received by the isolation capacitors 255 and shown in the second graph.

The differential equivalent of Vin_p 305 and Vin_m 320 is shown as Vpre_diff (IN) 730 and output from the isolation capacitors 255 to the input of the demodulator 265. The differential equivalent of the output of the preamplifier 320 is shown as Vpre_diff (OUT) 740. The RX (ISO)_diff 720, Vin_p 305, Vin_m 320, Vpre_diff (IN) 730, and Vpre_diff (OUT) 740 signals appear to correspond to each other well. Even at a high slew rate, the envelope detector 600 rejects the common mode transients represented by Vcmt 710 and navg 625 remains below nref 655. DATA (OUT) 390 remains consistent with the DATA (IN) signal 750.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs)).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

Modifications are possible in the described embodiments, and other embodiments are possible, within the scope of the claims.

What is claimed is:

1. An apparatus, comprising:

an envelope detector having first differential inputs, second differential inputs, and a detector output, the envelope detector including:

a first transistor having a first control terminal, a first current terminal, and a second current terminal;

a second transistor having a second control terminal, a third current terminal, and a fourth current terminal, in which the third current terminal is coupled to the first current terminal, the fourth current terminal is coupled to the second current terminal, and the first and second control terminals coupled to the first differential inputs;

a first filter coupled between the first current terminal and a first supply voltage terminal;

a third transistor having a third control terminal, a fifth current terminal, and a sixth current terminal;

a fourth transistor having a fourth control terminal, a seventh current terminal, and an eighth current terminal, in which the seventh current terminal is coupled to the fifth current terminal, and the eighth current terminal is coupled to the sixth current terminal, and the third and fourth control terminals coupled to the second differential inputs;

a second filter coupled between the fifth current terminal and the first supply voltage terminal;

a current source coupled to a second supply voltage terminal;

a resistor coupled between second and fourth current terminals and the current source; and a comparator having a first input, a second input and an output, in which the first input is coupled to the first current terminal, the second input is coupled to the fifth current terminal, and the output of the comparator coupled to the detector output.

2. The apparatus of claim 1, wherein the first filter has a first time constant, the second filter has a second time constant, and the envelope detector has a decay time based on the first and second time constants.

3. The apparatus of claim 1, wherein the first and second transistors are configured to, responsive to receiving a first voltage at the first control terminal and a second voltage at the second control terminal, store a third voltage in the first filter based on a peak value of the first and second voltages.

4. The apparatus of claim 1, wherein the third and fourth transistors are configured to, responsive to receiving a first voltage at the third control terminal and a second voltage at the fourth control terminal, store a third voltage in the second filter based on a peak value of the first and second voltages.

5. An apparatus, comprising:

a first differential pair of transistors;

a second differential pair of transistors;

a first capacitor coupled between a power terminal and first current terminals of the first differential pair of transistors;

a second capacitor coupled between the power terminal and first current terminals of the second differential pair of transistors;

a current source coupled between second current terminals of the first and second differential pairs of transistors and a reference terminal, the current source configured to provide a bias current to the first and second differential pairs of transistors; and a comparator having a negative input and a positive input, in which the negative input is coupled to the first current terminals, and the positive input is coupled to the second current terminals.

6. The apparatus of claim 5, wherein the first differential pair of transistors are configured to receive a first voltage and a second voltage at their inputs and store a third voltage based on a peak value of the first and second voltages at the first capacitor, and the second differential pair of transistors are configured to receive a fourth voltage and a fifth voltage at their inputs and store a sixth voltage based on a peak value of the fourth and fifth voltages at the second capacitor.

7. The apparatus of claim 6, further comprising a first resistor coupled between the power terminal and the first current terminals of the first differential pair of transistors and a second resistor coupled between the power terminal and the first current terminals of the second differential pair of transistors.

8. The apparatus of claim 7, wherein the first capacitor and the first resistor form a first filter, and the second capacitor and the second resistor form a second filter.

9. The apparatus of claim 5, further comprising a resistor coupled between the second current terminals of one of the first or second differential pair of transistors and the current source.

10. The apparatus of claim 8, wherein the first filter has a first time constant, the second filter has a second time constant, the first and second differential pairs of transistors are part of an envelope detector, and a decay time of the envelope detector being configured based on the first and second time constants.

11. The apparatus of claim 5, wherein the apparatus is part of a demodulator comprising a preamplifier, the preamplifier having first differential outputs coupled to first differential inputs of the first differential pair of transistors and second differential outputs coupled to second differential inputs of the second differential pair of transistors.

12. A circuit, comprising:

a first differential pair of transistors having a first terminal and a second terminal;

a first resistor capacitor (RC) network coupled between a power terminal and the first terminal;

a second differential pair of transistors having a third terminal and a fourth terminal;

a second RC network coupled between the power terminal and the third terminal;

a current source coupled between the second and fourth terminals and a reference terminal, the current source configured to provide a bias current to the first and second differential pairs of transistors;

a resistor coupled between one of the second or fourth terminals and the current source; and a comparator having a negative input and a positive input, in which the negative input is coupled to the first terminal, and the positive input is coupled to the third terminal.

13. The circuit of claim 12, wherein:

the first differential pair comprises:

a first transistor having a first control terminal, a first current terminal and a second current terminal, in which the first current terminal is coupled to the first terminal, and the second current terminal is coupled to the second terminal; and a second transistor having a second control terminal, a third current terminal and a fourth current terminal, in which the third current terminal is coupled to the first terminal, and the fourth current terminal is coupled to the second terminal; and the second differential pair comprises:

a third transistor having a third control terminal, a fifth current terminal and a sixth current terminal, in which the fifth current terminal is coupled to the third terminal, and the sixth current terminal is coupled to the fourth terminal; and a fourth transistor having a fourth control terminal, a seventh current terminal and an eighth current terminal, in which the seventh current terminal is coupled to the third terminal, and the eighth current terminal is coupled to the fourth terminal.

14. The circuit of claim 12, wherein the first differential pair of transistors are configured to receive a first voltage and a second voltage at their inputs and store a third voltage based on a peak value of the first and second voltages at the first RC network, and the second differential pair of transistors are configured to receive a fourth voltage and a fifth voltage at their inputs and store a sixth voltage based on a peak value of the fourth and fifth voltages at the second RC network.

15. The circuit of claim 12, wherein the first RC network has a first time constant, the second RC network has a second time constant, and the circuit has a decay time based on the first and second time constants.

16. The circuit of claim 12, further comprising a preamplifier coupled to first differential inputs of the first differential pair of transistors and second differential inputs of the second differential pair of transistors.

* * * * *